United States Patent
West

(10) Patent No.: US 8,227,839 B2
(45) Date of Patent: Jul. 24, 2012

(54) INTEGRATED CIRCUIT HAVING TSVS INCLUDING HILLOCK SUPPRESSION

(75) Inventor: Jeffrey Alan West, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 231 days.

(21) Appl. No.: 12/726,057

(22) Filed: Mar. 17, 2010

(65) Prior Publication Data

US 2011/0227227 A1 Sep. 22, 2011

(51) Int. Cl.
*H01L 23/48* (2006.01)
*H01L 29/40* (2006.01)

(52) U.S. Cl. .................. 257/276; 257/621; 257/758

(58) Field of Classification Search .............. 257/276, 257/621, 756
See application file for complete search history.

(56) References Cited

U.S. PATENT DOCUMENTS

| | | | | |
|---|---|---|---|---|
| 3,787,252 A * | 1/1974 | Filippazzi et al. | ............ | 438/492 |
| 5,432,999 A * | 7/1995 | Capps et al. | ................ | 438/109 |
| 7,309,651 B2 | 12/2007 | West et al. | | |
| 8,035,143 B2 * | 10/2011 | Jang | ............... | 257/292 |
| 2004/0259378 A1 * | 12/2004 | Chambers et al. | ............ | 438/771 |
| 2006/0205211 A1 * | 9/2006 | Kirby | ............. | 438/667 |
| 2007/0257373 A1 * | 11/2007 | Akram et al. | ................ | 257/774 |
| 2009/0140381 A1 | 6/2009 | Lin et al. | | |
| 2009/0294916 A1 * | 12/2009 | Ma et al. | ........................ | 257/621 |
| 2010/0258917 A1 * | 10/2010 | Lin | ............... | 257/621 |
| 2011/0037144 A1 * | 2/2011 | Chen et al. | .................... | 257/532 |

* cited by examiner

*Primary Examiner* — James Mitchell
(74) *Attorney, Agent, or Firm* — Steven A. Shaw; W. James Brady; Frederick J. Telecky, Jr.

(57) ABSTRACT

A method for fabricating integrated circuit (ICs) having through substrate vias (TSVs) includes forming active circuit elements on a semiconductor wafer and then forming a plurality of embedded vias through the top side of the wafer. A metal filler layer including a filler metal is deposited to fill the embedded vias. Chemical mechanical polishing (CMP) then forms a plurality of embedded TSVs that have polished top TSV surfaces having exposed filler metal. An electrically conductive hillock suppression structure is formed by forming a silicon or germanium doped region, or a silicide or germanicide at the polished top TSV surface or by forming a metal layer on the polished top TSV surface having a composition different from the filler metal. A dielectric layer is deposited on the semiconductor wafer including over the hillock suppression structure. The dielectric layer is removed over the polished top TSV surface to allow metal contact thereto.

13 Claims, 3 Drawing Sheets

INTEGRATED CIRCUIT HAVING TSVS INCLUDING HILLOCK SUPPRESSION

FIELD

Disclosed embodiments relate to integrated circuits (ICs) having through-substrate vias.

BACKGROUND

As known in the art, through-substrate vias (referred to herein as TSVs), which are commonly referred to as through-silicon vias, are vertical electrical connections that extend from one of the electrically conductive levels formed on the top side of the IC die (e.g., one of the metal interconnect levels) to the bottom side of the IC die. TSVs are commonly used as power TSVs (e.g., for VDD, VSS or ground) and/or signal TSVs.

TSVs allow the TSV comprising IC to be bonded to on both sides and utilize vertical electrical paths to couple to other IC devices (in either singulated die or wafer form), or to mount either side to a package substrate or interposer. The vertical electrical paths are significantly shortened relative to conventional wire bonding technology, generally leading to significantly faster device operation of the IC.

TSVs can be formed in a "via-first," a "via-middle," or a "via-last" approach. In the via-first approach the TSVs are formed in the wafer fab during front end processing. Via-first generally comprises TSV formation before the transistors (e.g. CMOS and/or bipolar transistors) are formed, and due to high temperature transistor processing (e.g. >900° C.), low resistivity metals which are not high temperature tolerant, such as copper, cannot be used as a TSV conductor. A via-middle approach generally takes place after transistor formation but before passivation processing, such as between the contact level and first metal interconnect, or after one or more levels of metal interconnect. For via-middle TSV processes, the TSVs after chemical-mechanical polishing (CMP) are next subjected to moderate temperature processing to form the dielectric over the TSVs, such as around 300 to 400° C. The via-last approach takes place in assembly and packaging and typically forms the TSVs from the bottom side of the IC die after wafer fab processing is completed (i.e. after passivation processing), so that via-last TSVs are generally not exposed to moderate temperature processing.

SUMMARY

The Inventor has recognized that when the filler metal (e.g. copper) in embedded TSVs is constrained at its sidewalls by the substrate, when heated with its top surface exposed, diffuses upwards to relieve the resulting compressive stress. For via-middle TSV processes that include copper or another metal filler material that has a significantly higher coefficient of thermal expansion (CTE) as compared to the IC substrate (e.g. silicon), the resulting $\Delta$CTE has been found to result in generation of stress-induced metal protrusions ("hillocks") emerging from the exposed top TSV surface. Hillock formation is a stress relief mechanism that generally relies on fast diffusion paths, predominantly through grain boundaries, that allows compressively stressed metal atoms such as Cu within the bulk of the TSV to escape to the only free surface at the top of the TSV.

For example, copper has a CTE of approximately 17 ppm/° C., whereas silicon has a CTE of approximately 2 to 3 ppm/° C. The Inventor has further recognized that hillocks emerging from the top of the TSV can interfere with subsequent back end of the line (BEOL) processing, such as creating topography that can cause in-line defects or disrupt planarization at subsequent metal interconnect pattern levels leading to open metal interconnect lines and/or open vias.

Disclosed embodiments solve the problem of thermal stress-induced hillocks for via-middle metal TSVs by blocking filler metal diffusion by providing an electrically conductive hillock suppression structure on the polished top TSV surface before deposition of the subsequent dielectric layer. Blocking the fast diffusion paths restricts diffusion of fast diffusing metals such as Cu to the TSV free surface, thereby suppressing hillock formation. In one particular embodiment, the hillock suppression is achieved by reacting the Cu at the TSV free surface with silane to form a silicon doped region or a silicide at the exposed top TSV surface and at near-surface grain boundaries that significantly retards diffusion of Cu out of the bulk of the TSV. If a silicide is formed, after the silicide surface is covered by a subsequently deposited layer such as a dielectric or metal layer, and thus is no longer a free surface susceptible to hillock generation, the silicide generally dissolves into the bulk Cu of the TSV to form a solid solution comprising atomic silicon during subsequent exposure to moderate temperatures (e.g. $\geq$350° C.). (See Hymes, et al, *J. Appl. Phys.* 83, #8, 4507 (1998).) A subsequently dissolving silicide as described above is referred to herein as a "temporary silicide".

In another embodiment, the hillock suppression structure includes a metal layer that comprises a metal other than the filler metal on the polished top TSV surface. Unlike the temporary silicide, the metal layer on the top of the TSV is generally present on the completed IC.

DETAILED DESCRIPTION

Figure 1:
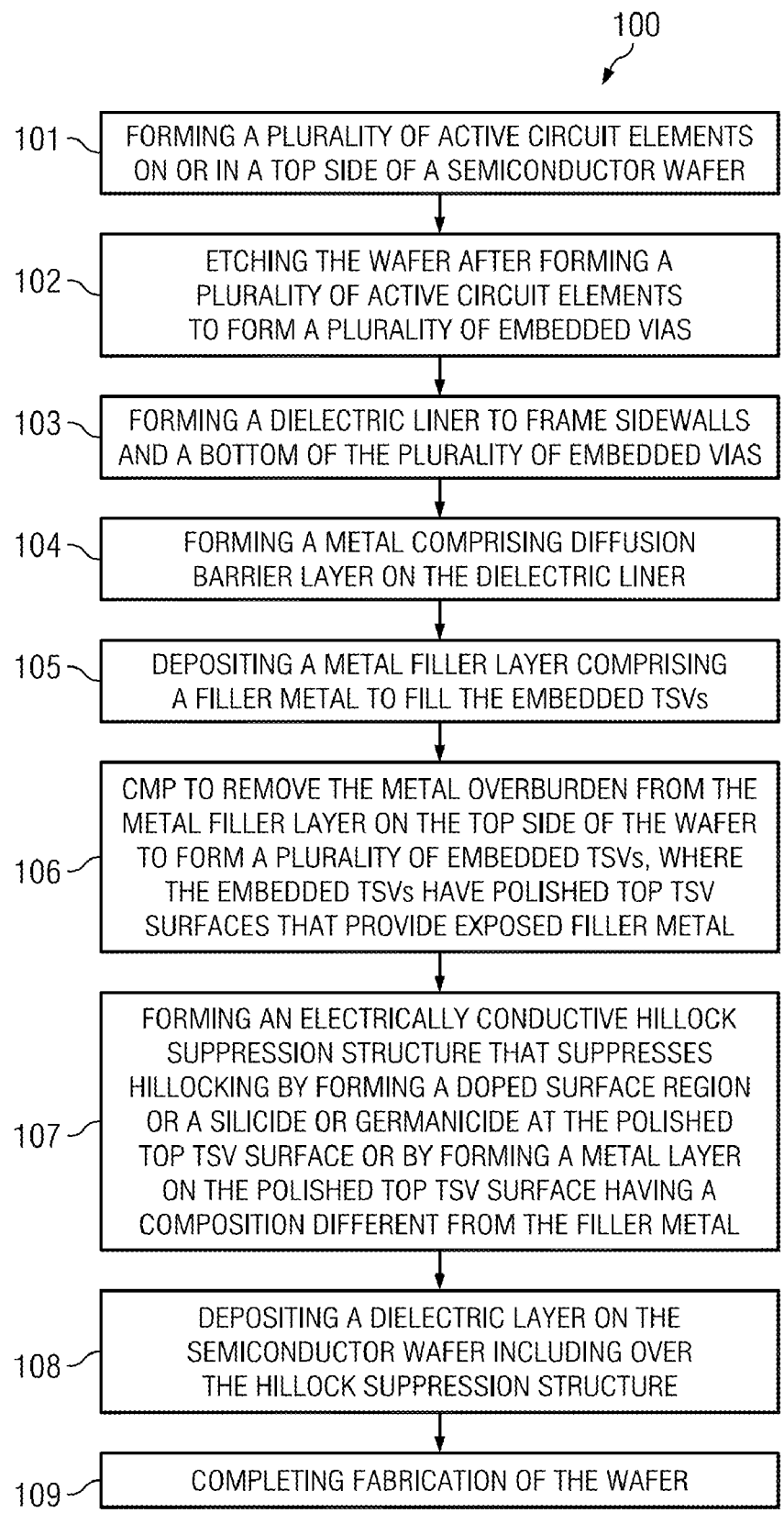
FIG. 1 shows steps in an exemplary via-middle method for fabricating ICs having TSVs that include an electrically conductive hillock suppression structure, according to a disclosed embodiment.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

FIG. 1 shows steps in an exemplary via-middle method 100 for fabricating ICs having TSVs that include an electrically conductive hillock suppression structure, according to a disclosed embodiment. Step 101 comprises forming a plurality of active circuit elements on or in a top side of a semiconductor wafer. The wafer may comprise any suitable material, for example, silicon, silicon-on-insulator (SOI), gallium arsenide (GaAs), or other material or combination of materials. Step 102 comprises etching the wafer after forming a plurality of active circuit elements to form a plurality of embedded vias. The etching to form the embedded vias is after the contact level processing and in one embodiment is before first metal processing. In another embodiment, the etching to form the embedded vias is between some intermediate metal levels (e.g. between 3rd and 4th metal in a 7 metal level process).

The embedded vias generally have a depth of at least 10 μm, such as 30 to 100 μms. The etching can comprise deep reactive-ion etching (DRIE). The aspect ratio (AR) of the etched via (and the resulting TSV) is generally from about 5:1 to 10:1, and in one embodiment is 6.5:1, such as TSVs having a 10 μm diameter and 65 μm depth/height. The TSV AR can be compared to the AR for metal damascene interconnect lines which are typically significantly less, such as <3:1.

Step 103 comprises forming a dielectric liner to frame sidewalls and a bottom of the plurality of embedded vias. The thickness range for the dielectric liner is generally 0.1 μm to 1 μm.

Step 104 comprises forming a metal comprising diffusion barrier layer on the dielectric liner. As known in the art, a metal comprising diffusion barrier layer thickness of about at least 4 nm is generally sufficient to prevent Cu penetration. The metal comprising diffusion barrier layer can comprise titanium, titanium nitride, tantalum, tantalum nitride, manganese, ruthenium, or combinations thereof. The metal comprising diffusion barrier layer is generally refractory metal comprising and, in some cases such as for ruthenium, can act as a seed layer for subsequent electroplating.

Step 105 comprises depositing a metal filler layer comprising a filler metal to fill the embedded TSVs. In one embodiment the filler metal comprises copper. In other embodiments, the filler metal can comprise gold or silver. Step 106 comprises CMP to remove any remaining metal overburden from the metal filler layer on the top side of the wafer to form a plurality of embedded TSVs, where the embedded TSVs have polished top TSV surfaces that provide exposed filler metal.

Step 107 comprises forming an electrically conductive hillock suppression structure that suppresses hillocking by forming a silicon or germanium doped region or a silicide or germanicide at the polished top TSV surface, or a metal layer having a composition different from the filler metal on the polished top TSV surface. Forming a Si or Ge doped region or a silicide or germanicide can comprise exposing the polished top TSV surface to a Group IV comprising gas, typically a gas mixture, that generally comprises silicon or germanium at a temperature of 250° C. to 450° C. In one embodiment, the gas comprises a 1 to 7 vol. % SiH$_4$ with a non-oxidizing gas such as N$_2$ or Ar, or a 1 to 7 vol. % GeH$_4$ with a non-oxidizing gas such as N$_2$ or Ar for a time of 0.5 s to several minutes, such as 5 to 20 s in a particular embodiment. In this particular embodiment, 4 vol. % SiH$_4$ with N$_2$ for 15 s at ~400° C. is used.

Various methods for forming the silicon or germanium doped region or silicide or germanicide at the polished top TSV surface will be apparent to those of ordinary skill in the art having reference to this Disclosure. It is noted that the silicide or germanicide if formed will generally be a temporary silicide or temporary germanicide that fully "dissolves" into the underlying bulk filler metal (e.g. Cu) during subsequent thermal processing (e.g., dielectric deposition in step 108 described below) so that no silicide/germanicide remains at the top TSV surface and the silicon or germanium liberated by the dissolution is fully incorporated into solution within the underlying Cu. With sufficient temperature and time, the solution can reach a homogenous concentration throughout the TSV.

The concentration of silicon or germanium doping in the TSV filler material of the completed device will depend on the total integrated silicon or germanium "dose" in the silicon or germanium doped region or in the case of a silicide/germanicide the amount of silicide or germanicide formed in step 107 and the ratio of the exposed top TSV surface to the volume of the bulk of the TSV. The silicon or germanium concentration is generally in the range of 0.000001 at. % to 0.05 at. %, such as 0.0001 to 0.05 at %. In one embodiment the surface silicon doped region can be formed by flowing SiH$_4$ gas over the TSV for a relatively short time, such as 2 to 15 seconds. For example, flowing a 4% SiH$_4$/N$_2$ gas at a rate of 670 sccms for approximately 3 to 5 seconds over a TSV comprising wafer at temperature of ~400° C. has been found to result ultimately (for the completed IC) in a silicon doping of approximately 0.001% for TSV depths of about 60 μm.

The presence of Si in a Cu TSV generally results in a minimal resistivity increase that can be estimated by considering the residual resistivity of bulk Cu due to dilute Si doping which has been reported to be linear with a value of about 5 μohm-cm/at.% Si. (See CRC Handbook of Electrical Resistivities of Binary Metallic Alloys, edited by K. Schroder (CRC, Boca Raton, Fla., 1983), pp. 233-234.) In one particular embodiment, about ~100 A of Cu$_3$Si (a copper silicide) is formed in step 107 which upon complete dissolution results in an estimated uniform silicon doping level for a 60 μm deep TSV of 0.00004 at. % which results in an estimated Cu resistivity increase of ~0.01%.

In one embodiment, an RF plasma can be struck during the exposure, or immediately after (i.e. while in the same tool) the exposure of the polished top TSV surface to the Group IV (e.g. Si or Ge) comprising gas such as SiH$_4$ or GeH$_4$, to create a silicon-rich or germanium-rich doped surface region that blocks surface filler metal such as Cu diffusion, and as a result suppresses hillock formation. A nitrogen plasma environment during and/or immediately after the Group IV comprising gas exposure may result in formation of a nitrided semiconductor (i.e., SiN, GeN) at the top surface and may inhibit subsequent dissolution into the underlying Cu.

In another embodiment forming an electrically conductive hillock suppression structure comprises selectively electrolessly plating a metal diffusion barrier layer on the polished top TSV surface. A typical thickness range is 1-20 nm. (See, for example, "T. Ishigami, et al, *Proc. IEEE* 2004 *International Technology Conf.*, pp 75-77 (2004)" and "*High Performance Reliability Cu Interconnect with Selective CoW Cap*," T. Ko, et al, *VLSI Digest of Technical Papers*, pp. 109-110 (2003).) The metal diffusion barrier layer can comprise a selective electrolessly plated conducting metals such as Co or Pd, or alloys such as CoW, CoWP, NiMoP, CoSnP; or selective CVD of Ru; or for case of Ag TSVs, a selective electrolessly plated alloy such as Ni—B.

Step 108 comprises deposition of a dielectric layer on the semiconductor wafer including over the hillock suppression structure. The deposition temperature for deposition of the dielectric layer is generally 250° C. to 400° C., such as at least 325° C., but can be higher or lower than this temperature range. In one embodiment the formation of the semiconductor comprising electrically conductive hillock suppression structure (step 107) and the depositing of the dielectric layer (step 108) are performed in-situ (i.e. in the same tool). In this embodiment, as described above, an RF plasma can be struck during formation of the semiconductor comprising electrically conductive hillock suppression structure (step 107) or immediately after step 107 and prior to step 108.

It is noted that for TSVs a majority of the filler metal (e.g. Cu) is generally surrounded by a CTE dissimilar substrate material, such as Si, whereas in damascene for metal (e.g. copper) interconnects the copper lead is surrounded by dielectric, such as a low-k dielectric (e.g. organic silicate glass (OSG), that can have a CTE similar to copper). As a result, the TSV case drives a much higher ΔCTE induced stress as compared to metal damascene thus having an even higher susceptibility to the formation of hillocks on the top surface of TSVs.

Moreover, conversion of the exposed top TSV surface (e.g. copper) to silicide (or germanicide) will not raise the bulk resistivity (see exemplary calculation above) of the TSV significantly due to the large filler metal volume to exposed surface ratio, which results in generally no measurable degradation in device performance. This can be compared to siliciding BEOL metal interconnect lines (with comparatively much lower volume:exposed surface ratio) which has been found by the Inventor to degrade device performance significantly due to the higher Si impurity level within the Cu that leads to a significant increase in the bulk resistivity.

In step 109, fabrication of the wafer is completed to form a plurality of IC die. Step 109 can include removing substrate material from the bottom side of the semiconductor wafer to expose the metal filler layer on the bottom side of the TSVs. However, in another embodiment, the TSVs are not exposed until after the IC die are segregated and attached to the substrate. Step 109 generally also includes forming at least one metal interconnect level (i.e., an ILD, IMD, trench, vias, barrier, and copper), any additional metal interconnect levels, and packaging of the device. Step 109 also includes removing the dielectric layer deposited in step 108 that is over the polished top TSV surface to allow metal contact thereto, such as by a first metal interconnect (M1).

Figure 2A:
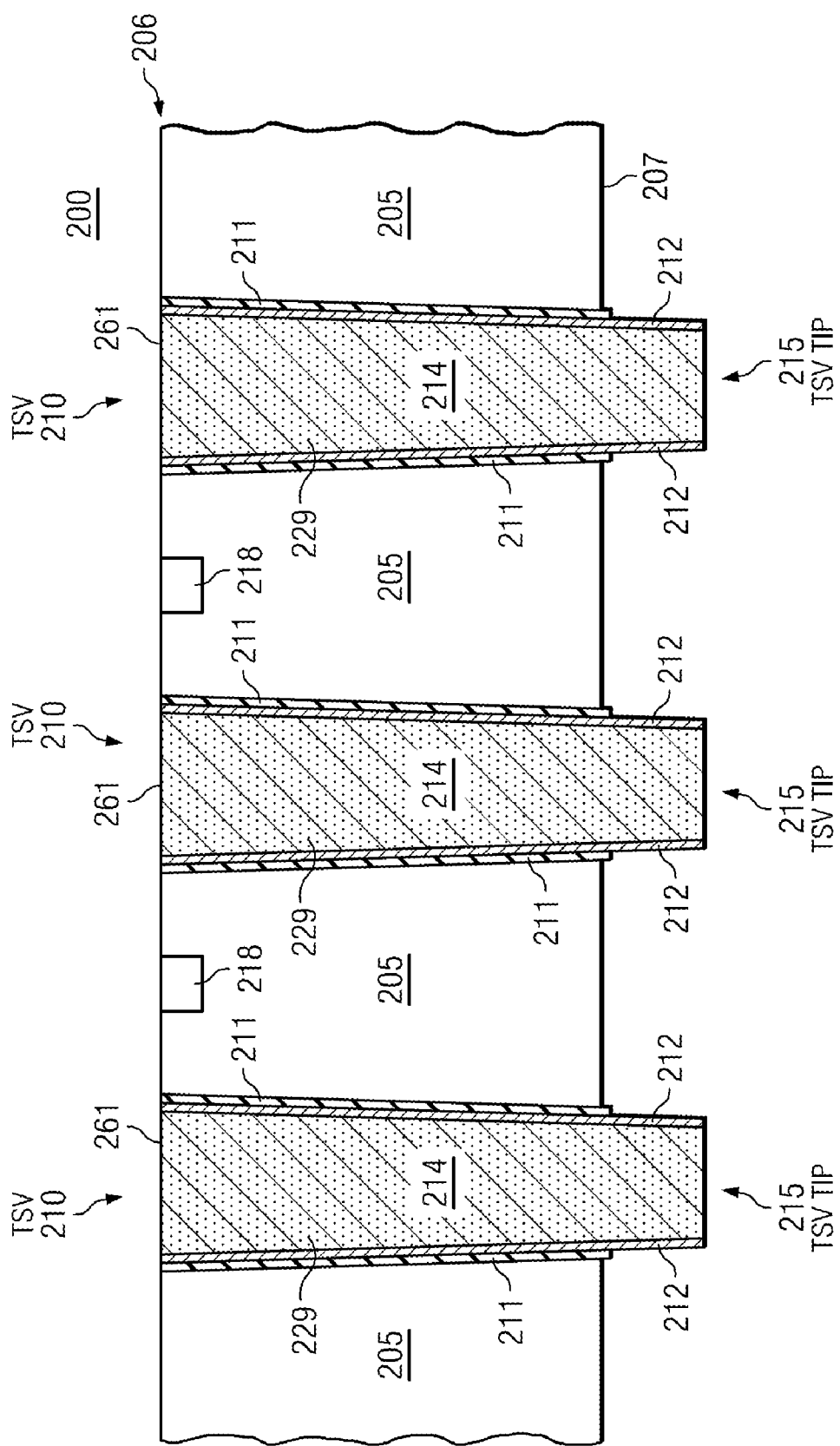
FIG. 2A is a simplified cross-sectional depiction of an IC comprising a plurality of TSVs having a polished top TSV surface, wherein the TSVs include silicon or germanium doping, according to a disclosed embodiment.

FIG. 2A is a simplified cross-sectional depiction of an IC 200 comprising a plurality of TSVs 210 having a polished top TSV surface 261, wherein the TSVs 210 include semiconductor doping, according to a disclosed embodiment. Contact, metal interconnect levels and passivation overcoat are omitted for clarity.

IC 200 comprises a substrate 205 including a top side 206 and a bottom side 207, wherein the top side 206 includes a plurality of active circuit elements 218 (e.g., transistors) formed in or on the top side 206. The substrate 205 has a final substrate thickness that is typically 50 to 100 µm (e.g., obtained by a backside thinning sequence that generally includes backgrinding, polishing, and etching), but can generally range between 7 and 200 µm. As described above, the substrate may comprise any suitable material, for example, silicon, silicon-on-insulator (SOI), gallium arsenide (GaAs), or other material or combination of materials.

The dielectric liner 211 generally comprises silicon oxide or silicon oxynitride that can be seen to be framing the TSVs 210 within substrate 205. A metal filler 214 generally comprising copper is on the metal comprising barrier layer 212 and substantially fills the TSVs 210.

The TSVs 210 shown in FIG. 2A are at least 10 µm long and can be seen to extend from the top semiconductor surface 206 to an optional integral TSV tip 215 that protrudes from the bottom surface 207 of the substrate 205. The protruding integral TSV tip 215 comprises the filler metal 214 and has a tip height that can be from 1 to 30 µm. However, in cases of a backside redistribution layer (RDL), the TSV is generally polished flat so that there is no protruding TSV tip. In the RDL embodiment, the metal RDL layer is patterned over the TSV 210 to create a metal bonding pad over the tip or to reroute to another location prior to bonding. Although not shown, the TSVs 210 can include a multilayer surface finish such as electroless Ni capped with an outer surface of a readily solder wettable metal such as Pd or Au.

The filler metal 214 includes semiconductor doping that provides a peak (i.e. maximum) silicon or germanium concentration of at least of 0.0000001 at. %. In one embodiment the doped region comprises silicon doping and the peak silicon concentration is from 0.0001 to 0.05 at. %. FIG. 2A shows Si or Ge atoms 229 which are depicted uniformly doping the filler metal 214 along the full height/depth of the TSVs 210. Although uniform (i.e. homogeneous) doping is shown in FIG. 2A, as described above, the doping in the final IC will generally not be uniform and thus have the highest concentration at or near the surface with a dopant concentration decreasing as the distance from the surface increases.

As described above, in the absence of a hillock suppression structure according to a disclosed embodiment present during the heat cycling associated with the dielectric deposition to form the dielectric layer (step 108 in Method 100 described above) over the TSVs, a significant concentration of hillocks would otherwise emerge from the polished top TSV surface 261. Hillocks emerging from the top of the TSV can interfere with subsequent BEOL processing, such as creating topography that can cause in-line defects or disrupt planarization at subsequent metal interconnect pattern levels leading to open metal interconnect lines and/or open vias. Disclose embodiments thus can improve yield and reliability of TSV ICs, particularly for Copper TSVs.

Figure 2B:
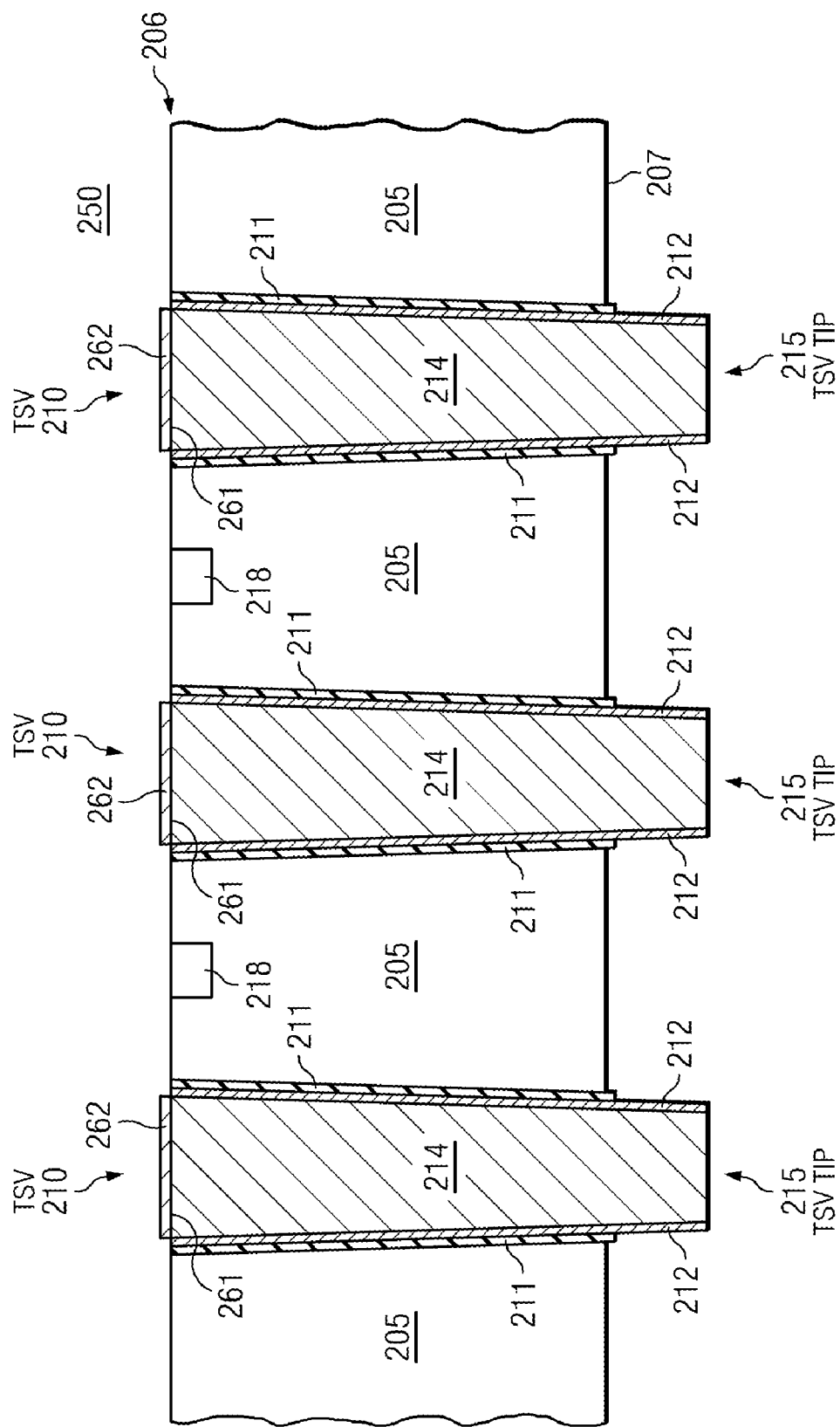
FIG. 2B is a simplified cross-sectional depiction of an IC comprising a plurality of TSVs that include a metal layer on the polished top TSV surface that has a composition different from that of the filler metal, according to a disclosed embodiment.

FIG. 2B is a simplified cross-sectional depiction of an IC 250 comprising a plurality of TSVs 260 that include a metal layer 262 on the polished top TSV surface 261 that has a composition different from that of the filler metal 214, according to a disclosed embodiment. As described above, metal layer 262 can comprise a metal diffusion barrier layer, such as Co or Pd, alloys such as CoW, CoWP, NiMoP, CoSnP; or selective CVD Ru; or for the case of Ag TSVs, electroless plating of Ni—B.

Advantages of disclosed embodiments include a significant reduction in TSV hillocks leading to a reduction in overall defect density sufficient to enable via-middle Cu TSVs to produce reasonable device yields, instead of W TSVs which are less prone to hillocks but raise the TSV resistivity by about 5× as compared to copper TSVs. Some method embodiments are compatible with existing tools, and can be performed in-situ, such as at the subsequent dielectric deposition. The methods disclosed herein are generally low cost solutions, such as when using $SiH_4$ which is typically widely available in fab environments.

EXAMPLES

Embodiments of the invention are further illustrated by the following specific Example, which should not be construed as limiting the scope or content of embodiments of the invention in any way.

The Inventor has found that the addition of a process comprising 15 sec in a gas mixture comprising 4% $SiH_4/N_2$ at temperature of about 400° C. to the free polished top TSV surface before dielectric deposition can lower hillock density by about an order of magnitude compared to dielectric deposition without this added process. Although this finding was based on experiments using BEOL large area Cu damascene structures, the results obtained should predict the behavior for TSVs. As described above, in the case of BEOL, this and related hillock reduction solutions disclosed herein cannot generally be used because it raises the Cu resistivity too high, whereas for TSVs, there is no significant resistivity penalty.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the Disclosure herein without departing from the spirit or scope of the disclosed embodiments. Thus, the breadth and scope of embodiments of the invention should not be limited by any of the above explicitly described embodiments. Rather, the scope of this Disclosure should be defined in accordance with the following claims and their equivalents.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method for fabricating integrated circuit (ICs) having through substrate vias (TSVs), comprising:
    forming a plurality of active circuit elements on or in a top side of a semiconductor wafer;
    forming a plurality of embedded vias through said top side of said semiconductor wafer after said forming said plurality of active circuit elements, said plurality of embedded TSVs having a depth of at least 10 μm;
    depositing a metal filler layer comprising a filler metal to fill said plurality of embedded vias;
    chemical mechanical polishing (CMP) said metal filler layer to form a plurality of embedded TSVs, said plurality of embedded TSVs comprising a polished top TSV surface that provides exposed filler metal;
    forming an electrically conductive hillock suppression structure by forming a Si or Ge doped region or a silicide or germanicide at said polished top TSV surface or forming a metal layer on said polished top TSV surface having a composition different from said filler metal;
    depositing a dielectric layer on said semiconductor wafer including over said hillock suppression structure, and
    removing said dielectric layer over said polished top TSV surface to allow metal contact thereto.

2. The method of claim 1, wherein said depositing said dielectric layer is performed at a temperature of at least 325° C.

3. The method of claim 1, wherein said forming said electrically conductive hillock suppression structure comprises exposing said polished top TSV surface to a gas that includes silicon or germanium at a temperature of 250° C. to 450° C.

4. The method of claim 3, wherein said gas comprises a 1 to 7 volume % $SiH_4$ with a non-oxidizing gas or a 1 to 7 volume % $GeH_4$ with a non-oxidizing gas, and wherein a time for said exposing is from 5 to 20 seconds.

5. The method of claim 3, wherein said forming said electrically conductive hillock suppression structure and said depositing of said dielectric layer are performed in-situ.

6. The method of claim 3, further comprising striking an RF plasma during said exposing or after said exposing and before said depositing said dielectric layer.

7. The method of claim 1, wherein said forming said electrically conductive hillock suppression structure comprises electrolessly plating a metal diffusion barrier layer.

8. The method of claim 7, wherein said metal diffusion barrier layer comprises a refractory metal.

9. The method of claim 7, wherein said metal diffusion barrier layer comprises Ru, Co, Pd, CoW, CoWP, NiMoP, CoSnP or Ni—B.

10. The method of claim 1, wherein said filler metal comprises copper and said top side of said semiconductor wafer comprises silicon.

11. The method of claim 1, wherein said forming said plurality of embedded vias is after contact level processing and before first metal processing.

12. An integrated circuit (IC) having through substrate vias (TSVs), comprising:
    a substrate comprising silicon having a bottom side and a top side comprising silicon including a plurality of active circuit elements formed in or on said top side;
    a plurality of TSVs having a depth of at least 10 μm including a copper filler layer and an outer dielectric liner, said TSVs including a polished top TSV surface, and semiconductor doping in said filler metal providing a peak silicon or germanium concentration of at least of 0.00001 at. %.

13. The IC of claim 12, wherein said semiconductor doping comprises silicon doping and said peak silicon concentration is from 0.0001 to 0.05 at. %.

* * * * *